United States Patent
Thompson et al.

(10) Patent No.: US 7,646,608 B2
(45) Date of Patent: Jan. 12, 2010

(54) HEAT TRANSFER PLATE

(75) Inventors: Alex Thompson, Fullerton, CA (US); Terence G. Ward, Redondo Beach, CA (US)

(73) Assignee: GM Global Technology Operations, Inc., Detroit, MI (US)

( * ) Notice: Subject to any disclaimer, the term of this patent is extended or adjusted under 35 U.S.C. 154(b) by 174 days.

(21) Appl. No.: 11/217,971

(22) Filed: Sep. 1, 2005

(65) Prior Publication Data
US 2007/0047209 A1   Mar. 1, 2007

(51) Int. Cl.
H05K 7/20 (2006.01)
F28F 5/00 (2006.01)
F28F 7/00 (2006.01)
F28D 11/00 (2006.01)

(52) U.S. Cl. .............. 361/711; 361/710; 361/707; 361/704; 165/185; 165/86

(58) Field of Classification Search ......... 361/712–713, 361/751, 688–693, 710, 704, 707, 711; 257/675; 165/80.2, 80.3, 185, 104.33, 86; 62/259.2
See application file for complete search history.

(56) References Cited

U.S. PATENT DOCUMENTS

| | | | | |
|---|---|---|---|---|
| 3,541,222 A * | 11/1970 | Kitaguchi et al. | ............ | 174/260 |
| 3,590,917 A * | 7/1971 | Huber et al. | ................ | 165/166 |
| 4,151,547 A * | 4/1979 | Rhoades et al. | ............ | 257/718 |
| 4,602,681 A * | 7/1986 | Daikoku et al. | ............ | 165/133 |
| 4,654,754 A * | 3/1987 | Daszkowski | ................ | 361/708 |
| 5,213,868 A * | 5/1993 | Liberty et al. | ................ | 428/131 |
| 5,253,702 A * | 10/1993 | Davidson et al. | ........... | 165/80.4 |
| 5,269,372 A * | 12/1993 | Chu et al. | ................... | 165/80.4 |
| 5,329,993 A * | 7/1994 | Ettehadieh | ............. | 165/104.14 |
| 5,660,917 A * | 8/1997 | Fujimori et al. | ........... | 428/195.1 |
| 5,761,037 A * | 6/1998 | Anderson et al. | ........... | 361/700 |
| 5,783,862 A * | 7/1998 | Deeney | ...................... | 257/714 |
| 6,037,658 A * | 3/2000 | Brodsky et al. | ............ | 257/707 |
| 6,054,198 A * | 4/2000 | Bunyan et al. | ............ | 428/40.5 |
| 6,059,579 A * | 5/2000 | Kresge et al. | ................. | 439/66 |
| 6,131,646 A * | 10/2000 | Kelley | ........................ | 165/80.1 |
| 6,280,584 B1 * | 8/2001 | Kumar et al. | .......... | 204/298.15 |
| 6,496,373 B1 * | 12/2002 | Chung | ........................ | 361/705 |
| 6,523,608 B1 * | 2/2003 | Solbrekken et al. | ........ | 165/185 |
| 6,672,378 B2 * | 1/2004 | Rauch | ........................ | 165/185 |
| 6,688,377 B2 * | 2/2004 | Wang | .................... | 165/104.26 |
| 6,797,881 B2 * | 9/2004 | Nakamura | ................... | 174/539 |
| 6,863,962 B2 * | 3/2005 | Nakatani et al. | ............. | 428/209 |
| 6,886,625 B1 * | 5/2005 | Sagal et al. | .................... | 165/46 |
| 6,896,045 B2 * | 5/2005 | Panek | ......................... | 165/185 |
| 6,901,997 B2 * | 6/2005 | Rauch | ........................ | 165/185 |
| 6,942,025 B2 * | 9/2005 | Nair et al. | ................... | 165/185 |
| 7,042,729 B2 * | 5/2006 | Dias et al. | .................. | 361/708 |

(Continued)

Primary Examiner—Jayprakash N Gandhi
Assistant Examiner—Bradley H Thomas

(57) ABSTRACT

An apparatus for coupling a heat-generating device to a heat-removing device. The apparatus includes a thermally-conductive plate having a first side and a second side. The apparatus also includes a plurality of first channels that intersect with a plurality of second channels formed on at least one of the first side and the second side. The formation of the first channels and the second channels weaken the thermally-conductive plate. The apparatus further includes a plurality of protrusions formed by the intersection of the first channels and the second channels. The protrusions are deformable by coupling the thermally-conductive plate between the heat-generating device and the heat-removing device.

18 Claims, 15 Drawing Sheets

U.S. PATENT DOCUMENTS

| | | | |
|---|---|---|---|
| 7,077,858 B2 * | 7/2006 | Fletcher et al. | 607/104 |
| 7,116,557 B1 * | 10/2006 | Raby et al. | 361/720 |
| 7,137,444 B2 * | 11/2006 | Faybishenko et al. | 165/185 |
| 7,200,006 B2 * | 4/2007 | Farrow et al. | 361/704 |
| 2002/0015288 A1 * | 2/2002 | Dibene et al. | 361/711 |
| 2003/0150605 A1 * | 8/2003 | Belady et al. | 165/185 |
| 2005/0168947 A1 * | 8/2005 | Mok et al. | 361/698 |
| 2006/0032615 A1 * | 2/2006 | Dussinger et al. | 165/104.26 |
| 2006/0120051 A1 * | 6/2006 | Macris et al. | 361/704 |
| 2006/0137856 A1 * | 6/2006 | Popovich | 165/80.4 |

* cited by examiner

US 7,646,608 B2

HEAT TRANSFER PLATE

CROSS-REFERENCE TO RELATED APPLICATIONS

This application relates to U.S. application Ser. No. 11/218,0653, filed on Sep. 1, 2005 and entitled Conformable Interface Device for Improved Electrical Joint, which is hereby incorporated by reference in its entirety as if fully set forth herein.

FIELD OF THE INVENTION

The present invention relates to a heat transfer device and particularly relates to a conformable heat transfer plate.

BACKGROUND OF THE INVENTION

Electronic and mechanical devices generate heat due to inefficiencies. The heat may be removed from the device to prevent possible damage due to overheating. For example, a heat sink may be mounted to the device. A surface on the heat sink may abut a surface on the device to form a thermal connection therebetween. The respective surfaces, however, are typically imperfect, which may provide less actual contact between the respective surfaces (e.g., metal-to-metal contact). Moreover, the imperfections may create a void and thus a volume of air between the respective surfaces. When there is less actual contact between the respective surfaces (e.g., air gaps due to surface imperfections), there may be less heat transfer therebetween.

Traditionally, a thermally-conductive paste and/or grease is added between the device and the heat sink. Thermal conductivity of the paste and/or grease may be low relative to a metal surface of the heat sink. Notwithstanding the low thermal conductivity, the paste and/or grease may fill the volume between the respective surfaces, which may relatively increase the area of contact and the heat transfer between the heat sink and the device. The paste and/or grease, however, may dry and crack over time, which may once again introduce air pockets. The air pockets may reduce the actual contact between the device and the heat sink, thus reducing the heat transfer therebetween and diminishing the benefit of the paste and/or grease. Moreover, use of the paste and/or the grease in mass production may be undesirable because of handling and/or assembly issues.

SUMMARY OF THE INVENTION

An apparatus for coupling a heat-generating device to a heat-removing device. The apparatus includes a thermally-conductive plate having a first side and a second side. The apparatus also includes a plurality of first channels that intersect with a plurality of second channels formed on at least the first side or the second side. The formation of the first channels and the second channels weaken the thermally-conductive plate. The apparatus further includes a plurality of protrusions formed by the intersection of the first channels and the second channels. The protrusions are deformable by coupling the thermally-conductive plate between the heat-generating device and the heat-removing device.

In one feature, the protrusions include a face having a surface area that abuts one of the heat-generating device and the heat-removing device, at least one of the faces increases its surface area when compressed between the heat-generating device and the heat-removing device.

In another feature, the thermally-conductive plate is electrically insulated.

In still another feature, the thermally-conductive plate is at least partially coated with parylene.

Further areas of applicability of the present invention will become apparent from the detailed description provided hereinafter. It should be understood that the detailed description and specific examples, while indicating the various embodiments of the invention, are intended for purposes of illustration only and are not intended to limit the scope of the invention.

BRIEF DESCRIPTION OF THE DRAWINGS

The present invention will become more fully understood from the detailed description, the appended claims and the accompanying drawings, wherein:

DETAILED DESCRIPTION OF THE VARIOUS EMBODIMENTS

The following description of the various embodiments is merely exemplary in nature and is in no way intended to limit the invention, its application, or uses.

Figure 1:
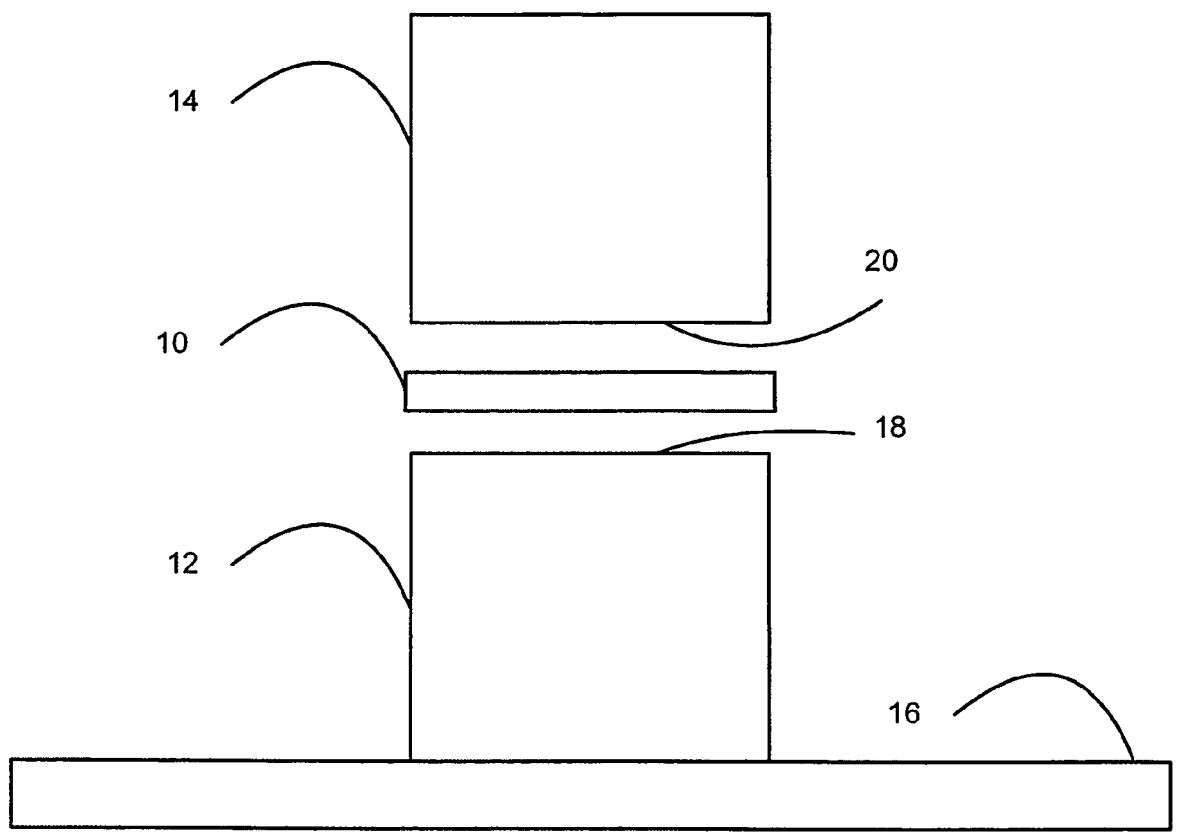
FIG. 1 is an exemplary schematic view of heat-generating device, a heat-removing device and a heat transfer plate constructed in accordance with the teachings of the present invention.

With reference to FIG. 1, a heat transfer plate 10 is shown in accordance with the teachings of the present invention. The heat transfer plate 10 may connect a heat-generating device 12 to a heat-removing device 14. The heat-generating device 12 may include, for example, an electronic device, a mechanical device and/or an electro-mechanical device, which may be coupled, for example, to a suitable substrate, board or housing 16. The electronic device may include, for example, a programmable logic device such as an integrated controller for use in an engine computer. The mechanical device may include, for example, a motor. The electromechanical device may include, for example, a re-writable memory device. The heat-removing device 14 may include, for example, cooling fins and/or other suitable passive cooling devices. The heat-removing device 14 may also include, for example, an active cooling device such as a heat exchanger, mechanical refrigeration and/or a Peltier thermoelectric device.

The heat-generating device 12 may have a heat-rejecting surface 18. The heat-removing device 14 may have a heat-accepting surface 20. The heat transfer plate 10 may be pressed between the heat-rejecting surface 18 of the heat-generating device 12 and the heat-accepting surface 20 of the heat-removing device 14. The pressing of the heat transfer plate 10 between the two devices 12, 14 may cause the heat transfer plate 10 to compress and conform to the surfaces 18, 20 of the devices 12, 14, respectively.

Figure 2:
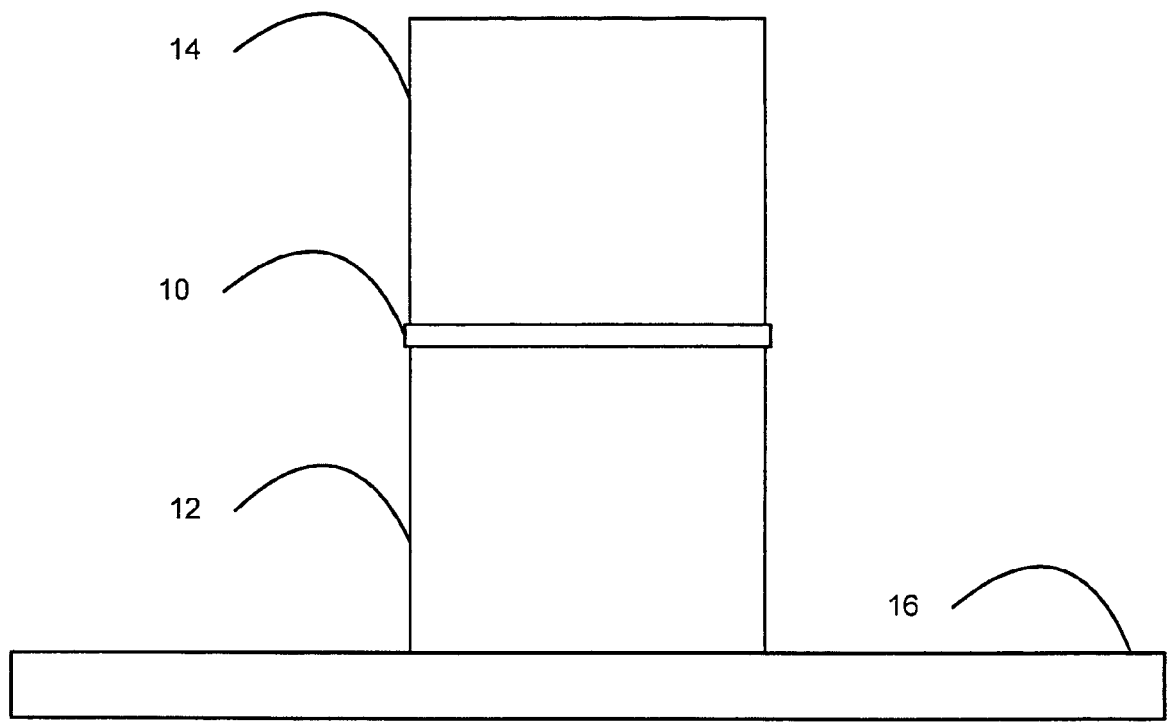
FIG. 2 is similar to FIG. 1 and shows the heat transfer plate sandwiched between the heat-generating device and the heat-removing device.

With reference to FIGS. 1 and 2, sufficient pressure may be applied to the heat-removing device 14 to compress the heat transfer plate 10 beneath, in accordance with the various embodiments of the present invention. The heat transfer plate 10 is disposed between the heat-rejecting surface 18 of the heat-generating device 12 and the heat-accepting surface 20 of the heat-removing device 14. By way of example, the heat-generating device 12 may be a traditional central processing unit on a computer and the heat-removing device 14 may be a Peltier thermoelectric device. The sufficient pressure applied to the heat-removing device 14 compresses the heat transfer plate 10 between the two devices 12, 14 causing the heat transfer plate 10 to conform to the surfaces 18, 20 respectively. When the heat transfer plate 10 compresses between the two surfaces 18, 20, the heat transfer plate 10 may spread out and make more metal-to-metal contact with the two surfaces 18, 20 to increase heat transfer therebetween.

It will be appreciated that compressing the heat transfer plate 10 between the respective surfaces 18, 20 may increase the metal-to-metal contact when compared to the respective surfaces 18, 20 coupled without the heat transfer plate 10. The increased metal-to-contact may increase the heat transfer therebetween. For example, the compressing of the heat transfer plate 10 between respective surfaces 18, 20 the may mimic the compressing of a traditional paste or grease between the same, as the heat transfer plate 10 may fill the space created by the surface imperfections between the heat-generating device 12 and the heat-removing device 14.

Figure 3:
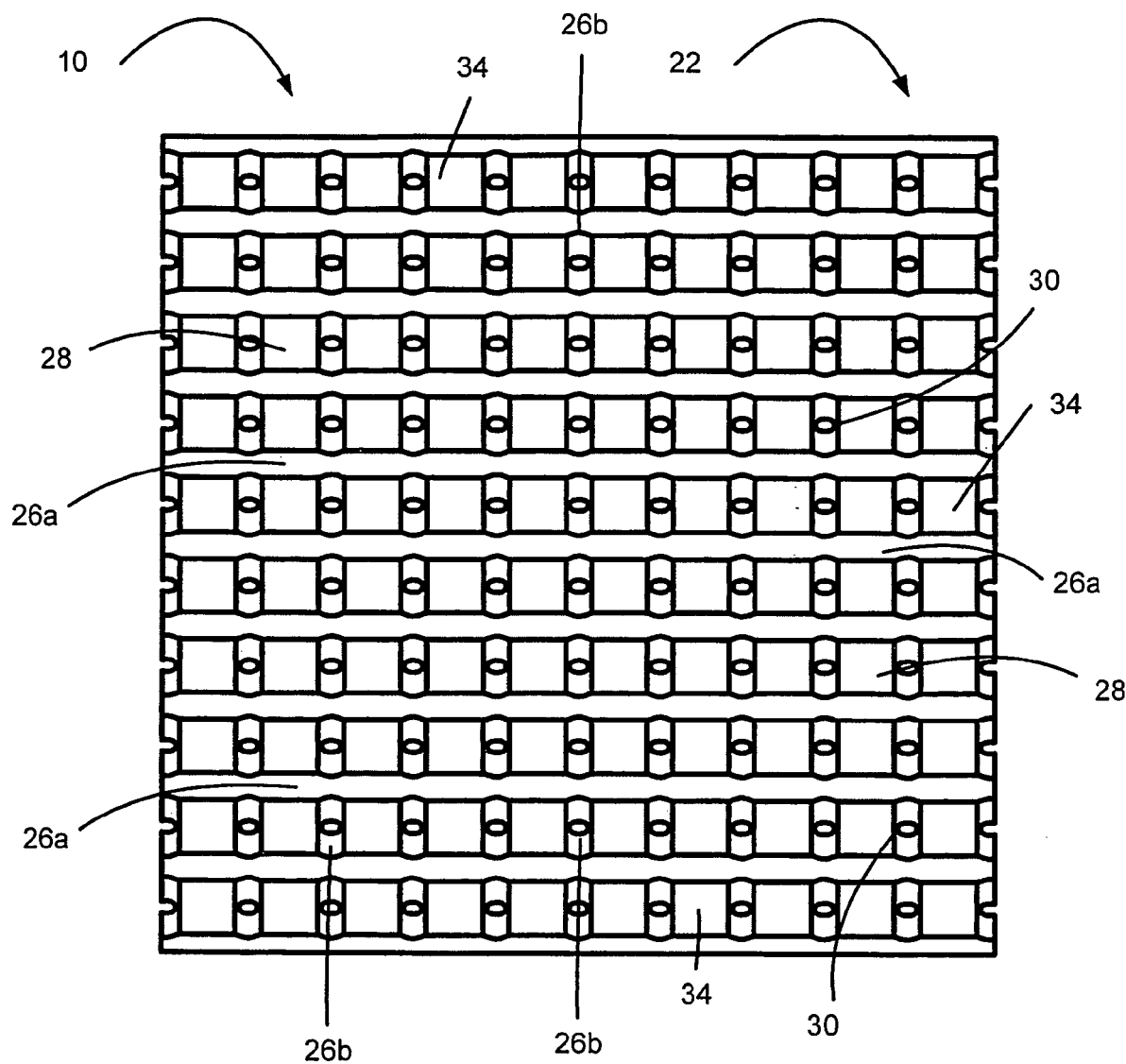
FIG. 3 is a top view showing a first side of the heat transfer plate constructed in accordance with the teachings of the present invention.
Figure 4:
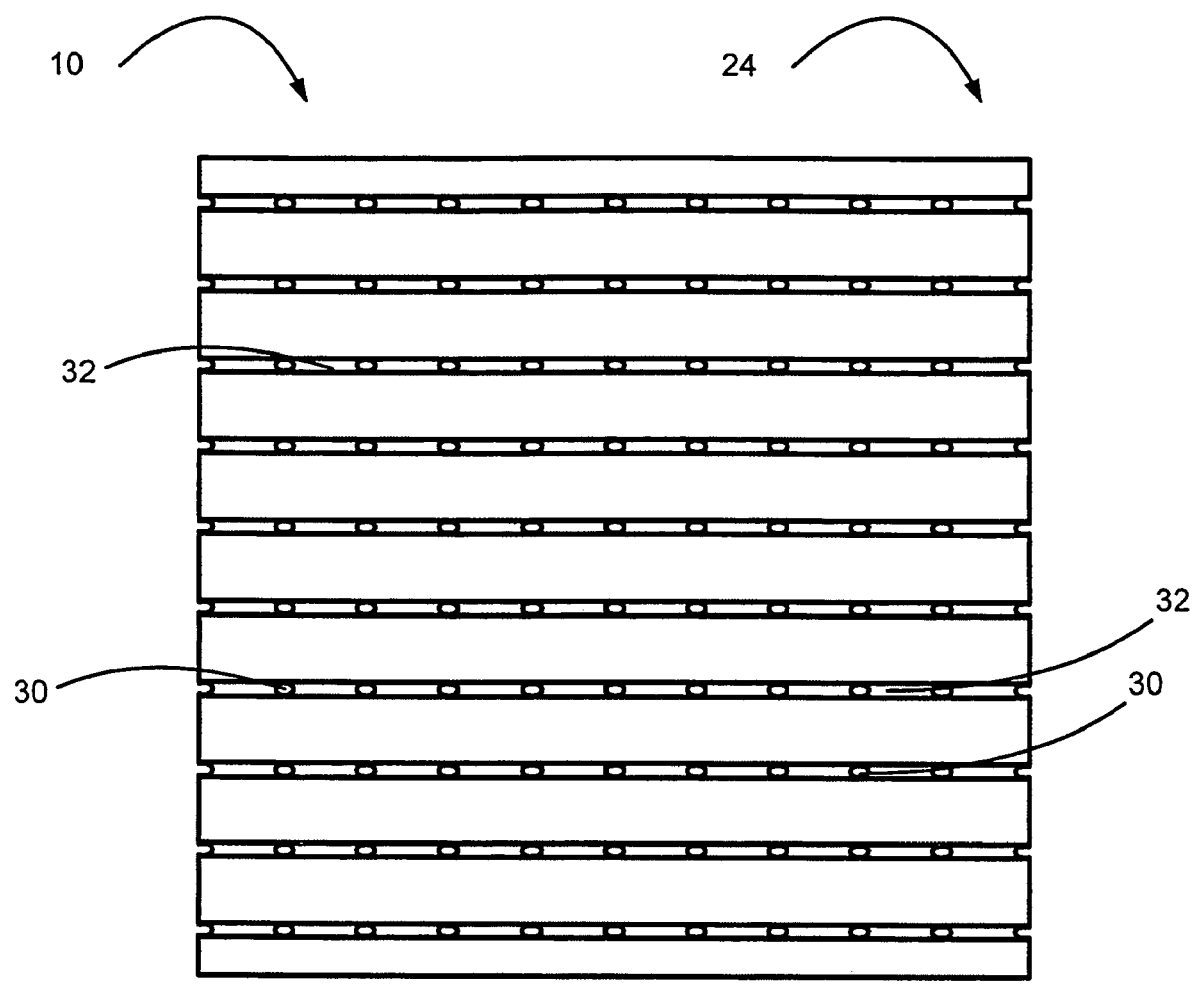
FIG. 4 is a bottom view showing a second side of the heat transfer plate of FIG. 3.

With reference to FIGS. 3 and 4, one embodiment of the heat transfer plate 10 is shown in accordance with the present invention. The heat transfer plate 10 has a first side 22 (FIG. 3) and a second side 24 (FIG. 4). With specific reference to FIG. 3, the first side 22 of the heat transfer plate 10 may include a plurality of channels 26 formed in the heat transfer plate 10. The channels 26 may be horizontal 26a and/or vertical 26b (collectively referred to hereinafter as channels 26) and as such are orthogonal to each other. A plurality of rectangular-shaped portions 28 may be formed at the intersection of the horizontal and the vertical channels 26. The first face 22 also may include a plurality of apertures 30 formed in the horizontal and/or vertical channels 26. It may be appreciated that the channels 26 need not be orthogonal to one and therefore the rectangular-shaped portions 28 need not be rectangular but may be any geometric shape that results from the intersection of the channels 26 at various angles.

With reference to FIG. 4, the second side 24 of the heat transfer plate 10 includes additional horizontal channels 32. Moreover, the same apertures 30 (also illustrated in FIG. 3) are formed in the horizontal channels 32. More specifically, the apertures 30 intersect the vertical channels 26b (FIG. 3) and the horizontal channels 32 and, as such, are formed through the heat transfer plate 10.

The heat transfer plate 10 may be formed from a solid rectangular plate (i.e., no channels and apertures formed thereon). The process of forming the heat transfer plate 10 of the present invention may involve removing material from the solid rectangular plate, which weakens the plate. In one embodiment, an etching process may be used to remove the material thus forming the plurality of horizontal and vertical channels 26, 32 as shown in FIGS. 3 and 4. By way of the above example, each face 34 (FIG. 3) of the plurality of the rectangular-shaped portions 28 includes the original surface of the plate, as the channels 26, 32 are removed around the rectangular-shaped portion 28 during, for example, the etching process. Moreover, the channels 26, 32 may formed with a sufficient depth that when the vertical channels 26b on the first side 22 (FIG. 3) intersect with the channels 32 on the second side 24 (FIG. 4), the plurality of apertures 30 are formed.

When the heat transfer plate 10 is compressed between a heat-generating device 12 (FIG. 1) and a heat-removing device 14 (FIG. 1), the rectangular-shaped portions 28 will compress thus deforming under the force applied. It may be appreciated that the deformation of the rectangular-shaped portions 28 causes a greater surface area to be exposed to the heat-accepting surface 20 of the heat-removing device 14 because the rectangular-shaped portions 28 spread out when deformed. The deformation of the rectangular-shaped portions 28 also permits the heat transfer plate 10 to better conform to surface irregularities on the heat-accepting surface 20 and/or the heat-rejecting surface 18. It may also be appreciated that the heat transfer plate 10 may be sized in situ for various models of heat-generating and heat-removal devices.

For example, the heat transfer plate 10 may be cut to size in situ (i.e., not prepared beforehand or in a separate process) and placed between an integrated controller (e.g., the heat-generating device 12) and cooling fins (e.g., the heat-removing device 14). The cooling fins have a heat-accepting surface 20 that abuts the first side 22 of the heat transfer plate 10. More specifically, the heat-accepting surface 20 abuts the face 34 of the rectangular-shaped portions 28. The integrated controller has the heat-rejecting surface 18 that abuts the second side 24 of the heat transfer plate 10. When pressure is applied to the cooling fins toward the integrated controller, the heat transfer plate 10 is compressed therebetween.

By way of the above example, each face 34 of the rectangular-shaped portions 28 has an original surface area (i.e., $SA_O$) that abuts the heat-accepting surface 20 of the cooling fins. The heat transfer plate also has an original height (i.e., $H_O$). After compressing the heat transfer plate 10 between the cooling fins and the integrated controller, each face 34 of the rectangular-shaped portions 28 have a final (i.e., after compressing) surface area (i.e., $SA_F$) and the heat transfer plate has a final height (i.e., $H_F$). Because the rectangular-shaped portions 28 compress between the cooling fins and integrated controller, the final surface area is larger than the original surface area (i.e., $SA_F > SA_O$) and the final height is less than the original height (i.e., $H_F < H_O$). It may be appreciated that due to surface irregularities the entire heat transfer plate need not deform and, as such, there may be localized regions of the heat transfer plate where no deformation takes place (i.e., $SA_F = SA_O$ and $H_F = H_O$).

The heat transfer plate 10 may be constructed of a suitable material that is thermally conductive such as copper. It may be appreciated that the heat transfer plate 10 may be made of various materials and combinations thereof that provide relativity high thermal conductivity. In addition, the heat transfer plate may be configured to be non-electrically conductive as to electrically insulate the heat-generating device 12 from the heat-removing device 14. In one embodiment, the heat transfer plate 10 may be coated with parylene to make the heat transfer plate 10 non-electrically conductive. It may also be appreciated that other suitable coatings may be applied to the heat transfer plate 10 to reduce or eliminate electrical conductivity.

In one embodiment of the present invention, the heat transfer plate may have a thickness (i.e., a dimension from the first side 22 (FIG. 3) to the second side 24 (FIG. 4)) of about 0.003 inches (about 0.076 millimeters). A width of the horizontal channels 26a (FIG. 3) may be about 0.003 inches (about 0.076 millimeters). The dimensions of the rectangular-shaped portions 28 may be about 0.006 inches by about 0.006 inches (about 0.15 millimeters by about 0.15 millimeters). It may be appreciated that the thickness of the heat transfer plate 10 may be about equal to the width of the channels 26, 32. It may also be appreciated that the above-stated dimensions need not be implemented exactly but only serve as exemplary dimensions that provide for a conformable heat transfer plate 10.

Figure 5:
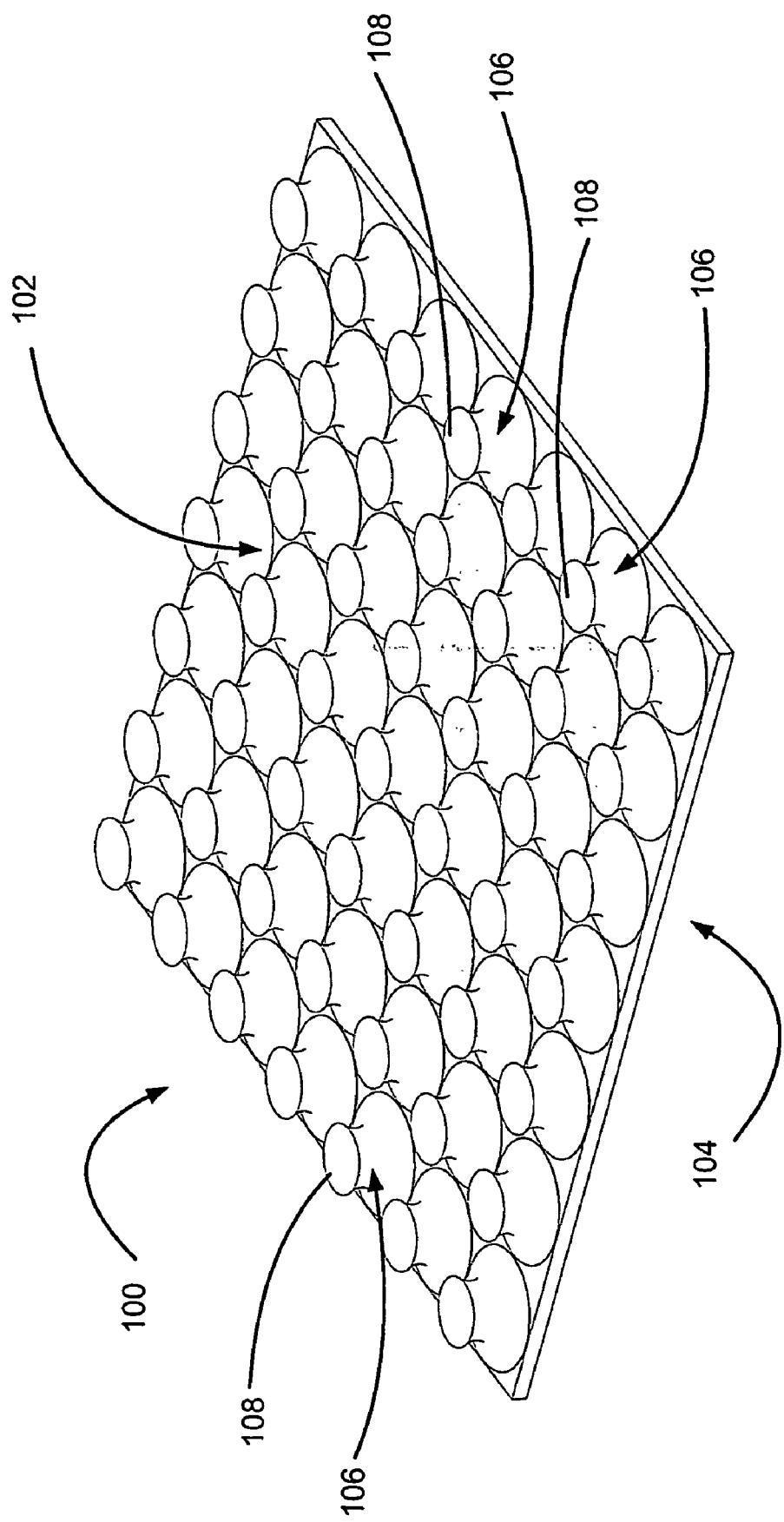
FIGS. 5-7 are perspective views of alternative embodiments of a heat transfer plate constructed in accordance with the teachings of the present invention.

With reference to FIG. 5, an alternative embodiment of a heat transfer plate 100 is shown and constructed in accordance with the teachings of the present invention. The heat transfer plate 100 may include a first side 102 and a second side 104. The first side 102 may include a plurality of round posts 106. The round post 106 may be formed from removal of adjacent material during, for example, the etching process, which is similar to the above-described fabrication of the heat transfer plate 10 (FIG. 3). As such, each face 108 of the posts 106 may include the original surface of the first side 102 of the heat transfer plate 100. The posts 106 may compress or deform under pressure between the above-described heat-generating device 12 and the heat-removing device 14, as shown in FIG. 2. Moreover, when the heat transfer plate 100 compresses between the heat-generating device 12 and the heat-removing device 14, the round posts 106 may compress and spread out to make relatively better metal-to-metal contact with the devices 12, 14 and increase the heat transfer therebetween.

Figure 6:
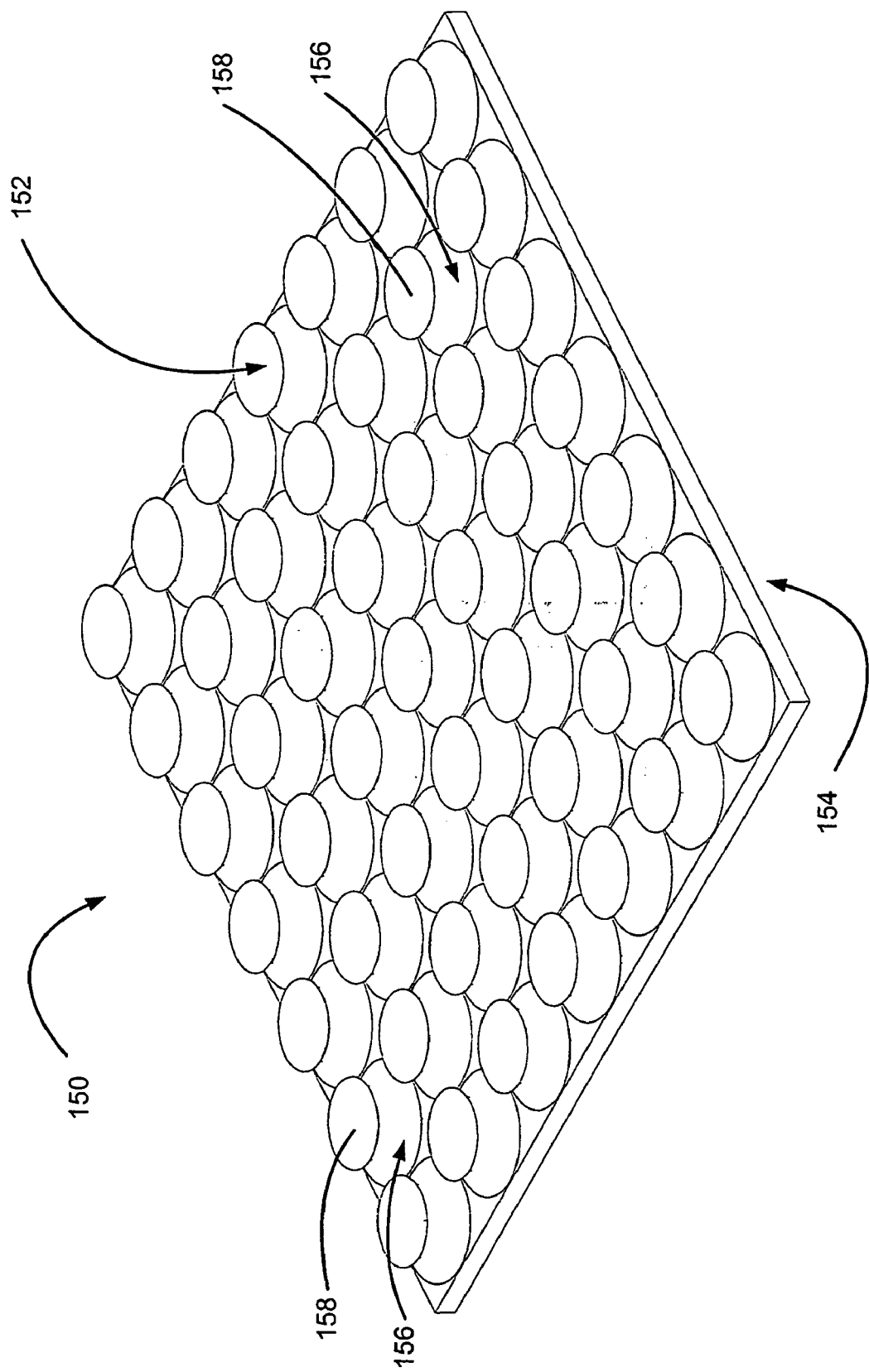

With reference to FIG. 6, an alternative embodiment of a heat transfer plate 150 is shown and constructed in accordance with the teachings of the present invention. The heat transfer plate 150 may include a first side 152 and a second side 154. The first side 152 may include a plurality of round posts 156. The round post 156 may be formed from removal of adjacent material during, for example, the etching process, which is similar to the above-described fabrication of the heat transfer plate 10 (FIG. 3). As such, each face 158 of the posts 156 may include the original surface of the first side 152 of the heat transfer plate 150. The posts 156 may compress or deform under pressure between the above-described heat-generating device 12 (FIG. 2) and the heat-removing device 14 (FIG. 2). Moreover, when the heat transfer plate 100 compresses between the heat-generating device 12 and the heat-removing device 14, the round posts 156 may compress and spread out to make relatively better metal-to-metal contact with the devices 12, 14 and increase the heat transfer therebetween.

Figure 7:
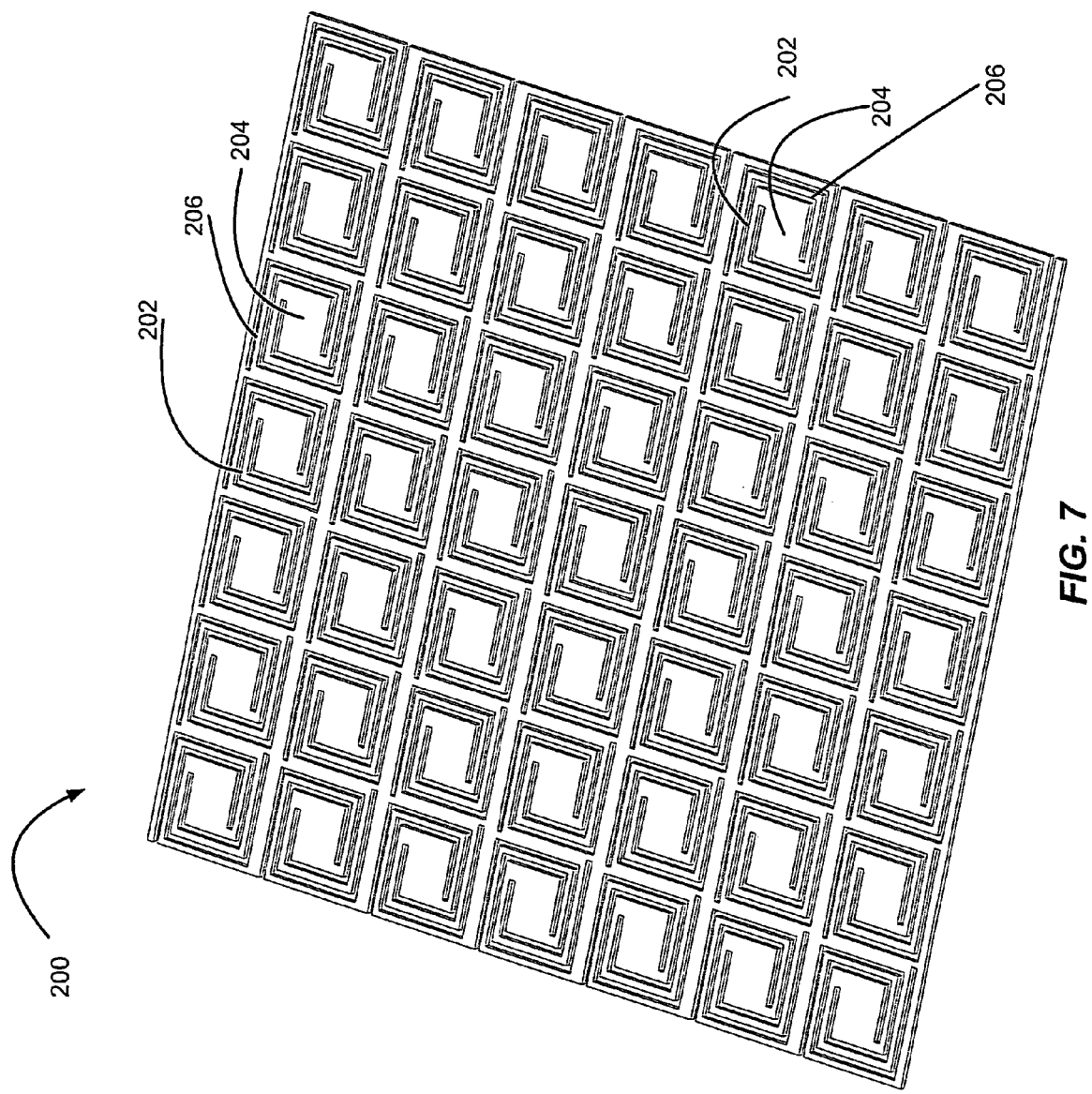

With reference to FIG. 7, an alternative embodiment of the heat transfer plate 200 is shown and constructed in accordance with the teachings of the present invention. The heat transfer plate 200 may include a plurality of channels 202 cut therefrom. The channels 202 may be cut, for example, using the above-described exemplary etching process or by stamping. By forming the plurality of channels 202 in the heat transfer plate 200, a plurality of panels 204 and slats 206 may be formed in the heat transfer plate 200. It will be appreciated that as the heat transfer plate 200 is compressed between the heat-generating device 12 (FIG. 2) and heat-removing device 14 (FIG. 2), each of the panels 204 and/or the slats 206 may be urged toward the surfaces 18, 20 (FIG. 1) of the two devices 12, 14.

Figure 8:
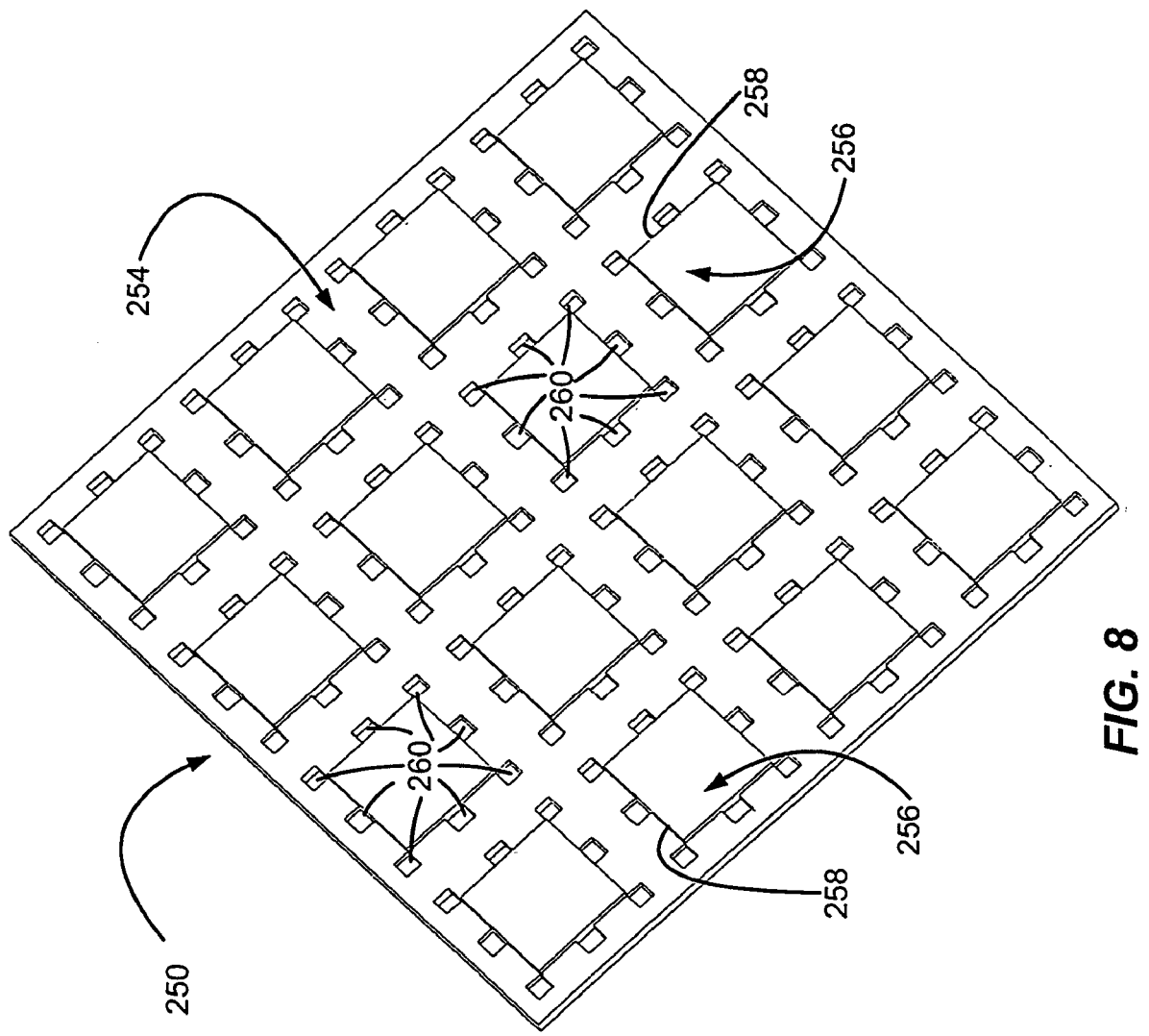
FIG. 8 is a perspective view of another embodiment of a heat transfer plate constructed in accordance with the teachings of the present invention.
Figure 9:
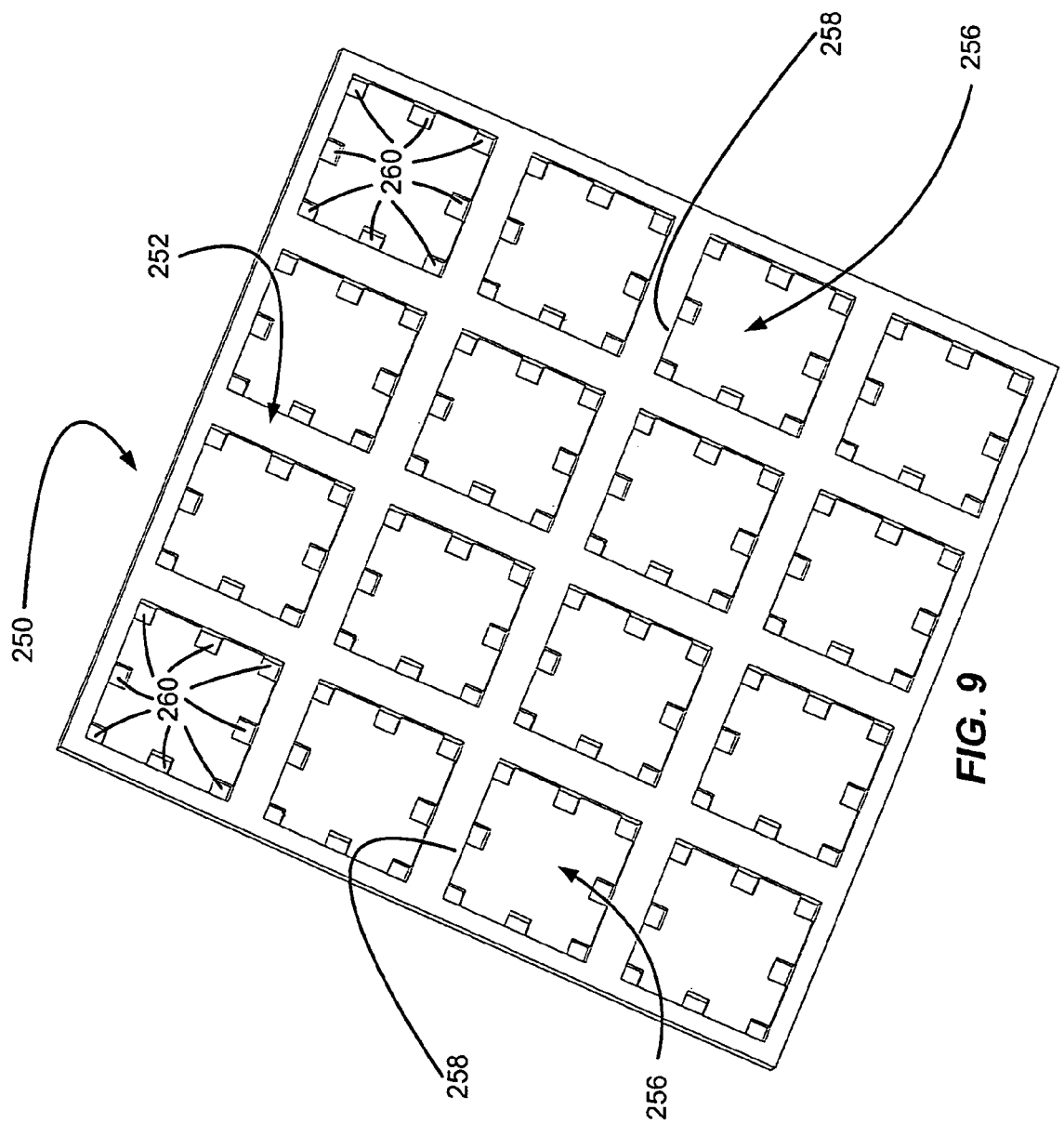
FIG. 9 is similar to FIG. 8 and shows an opposite face of the heat transfer plate.

With reference to FIGS. 8 and 9, another embodiment of the heat transfer plate 250 is shown and constructed in accordance with the teachings of the present invention. The heat transfer plate 250 may include a first side 252 (FIG. 9) and a second side 254 (FIG. 8). Each side of the heat transfer plate 250 may include a plurality of rectangular-shaped windows 256 cut therefrom. In a periphery 258 of each of the windows 256, a plurality of tabs 260 may be formed thereon. It may be appreciated that as the heat transfer plate 250 is compressed between the heat-generating device 12 (FIG. 2) and the heat-removing device 14 (FIG. 2), the tabs 260 may compress against the surfaces 18, 20 (FIG. 1) of the two devices 12, 14.

Figure 10:
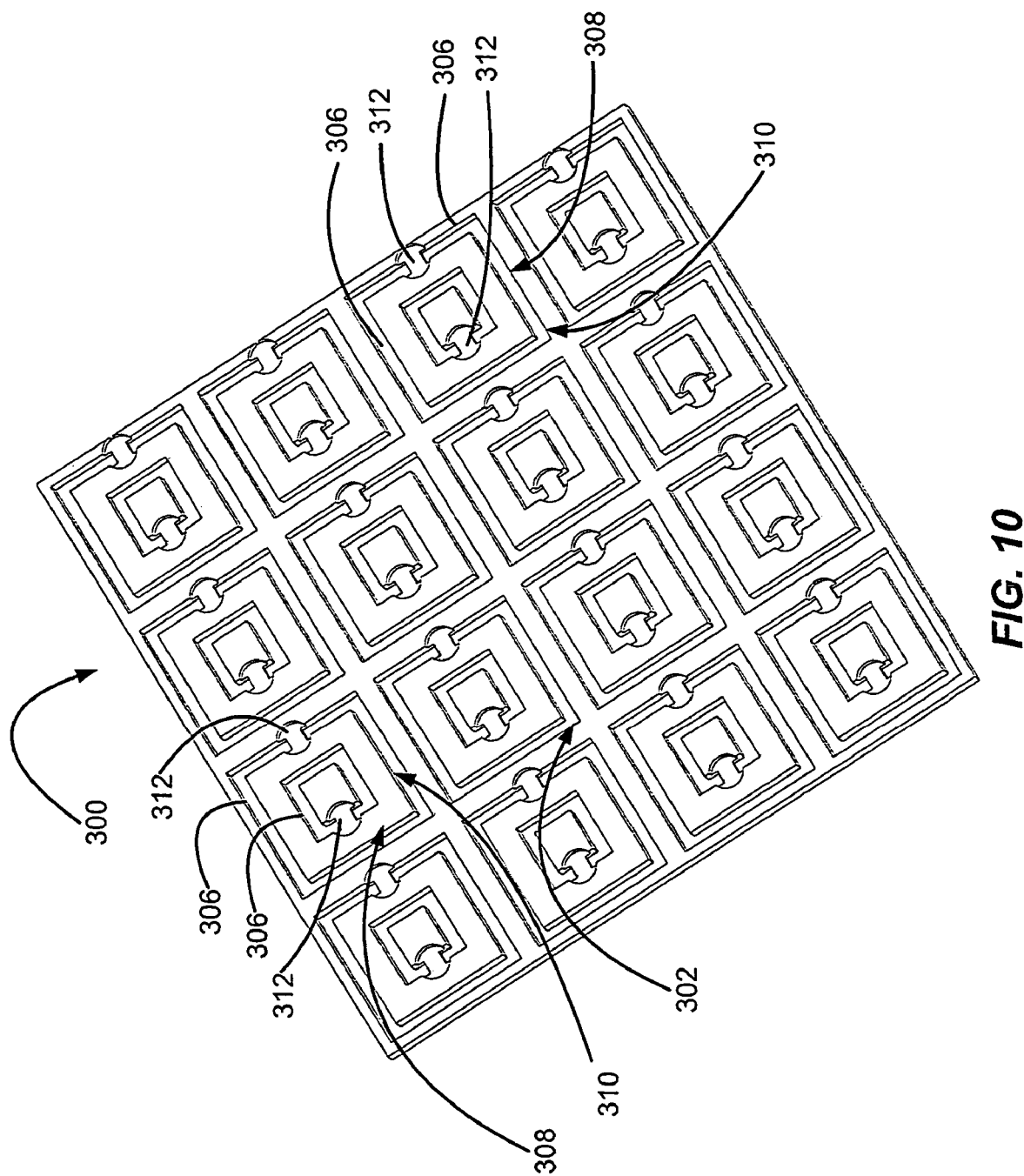
FIG. 10 is a perspective view of another embodiment of a heat transfer plate constructed in accordance with the teachings of the present invention.
Figure 11:
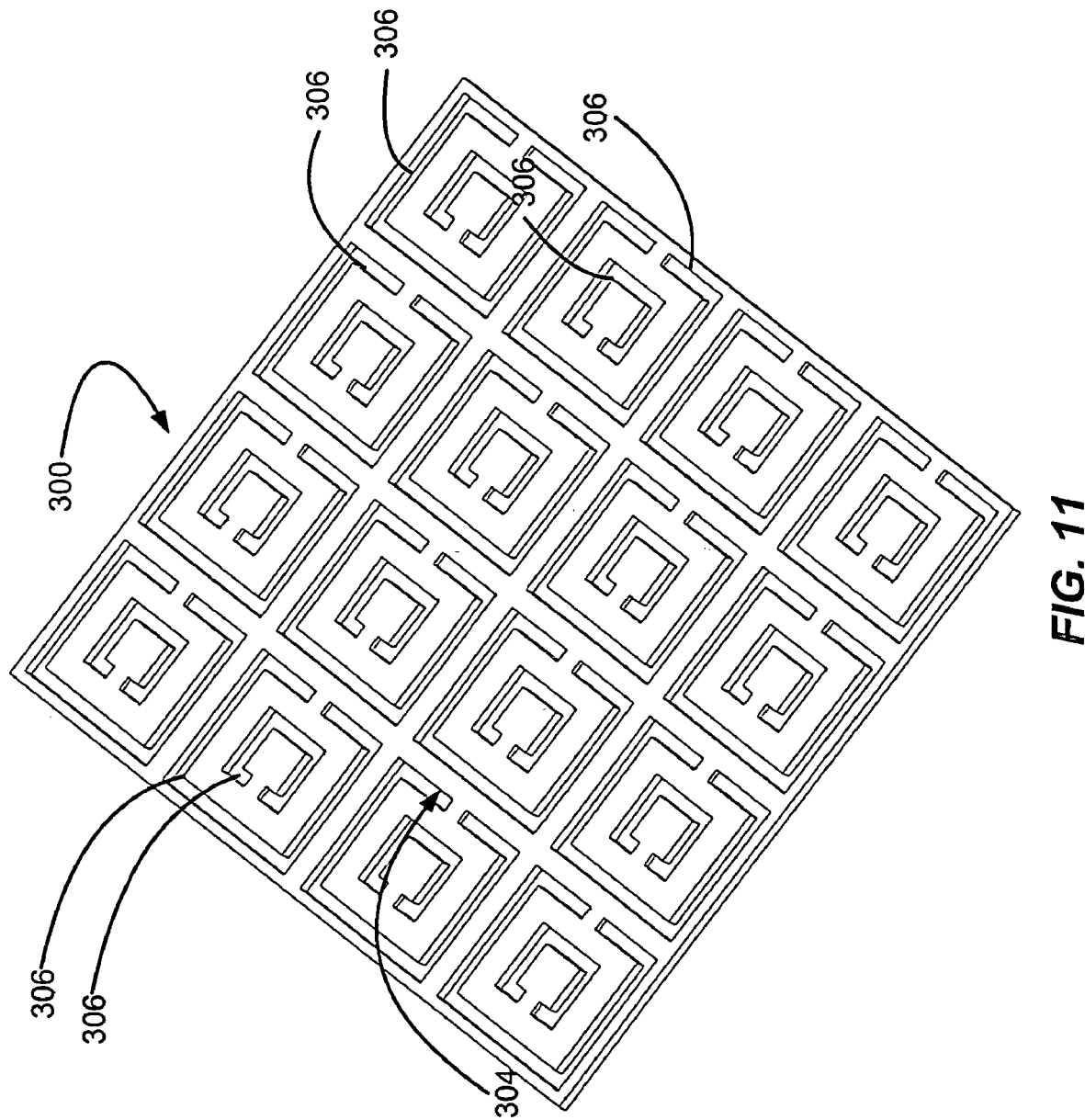
FIG. 11 is similar to FIG. 10 and shows an opposite face of the heat transfer plate.

With reference to FIGS. 10 and 11, another embodiment of the heat transfer plate 300 is shown and constructed in accordance with the teachings of the present invention. The heat transfer plate 300 may include a first side 302 (FIG. 10) and a second side 304 (FIG. 11). The heat transfer plate 300 may also include a plurality of c-shaped apertures 306 formed therein. More specifically, two opposed c-shaped channels 308 of the plurality of c-shaped apertures 306 may be arranged in a square like shape 310, which may be duplicated throughout the first side 302 and the second side 304 of the heat transfer plate 300. Each end of c-shaped channel 306 may terminate in a dimple 312 that is only visible on the first side 302 of the heat transfer plate 300. On the second side 304 of the heat transfer plate 300, the c-shaped apertures 306 are shown as the aperture is cut clear through the plate unlike the dimple which is only visible on the first side. As the heat transfer plate is compressed between the heat-generating device and the heat-removal device the plate is able to deform and make contact with the surface irregularities.

Figure 12:
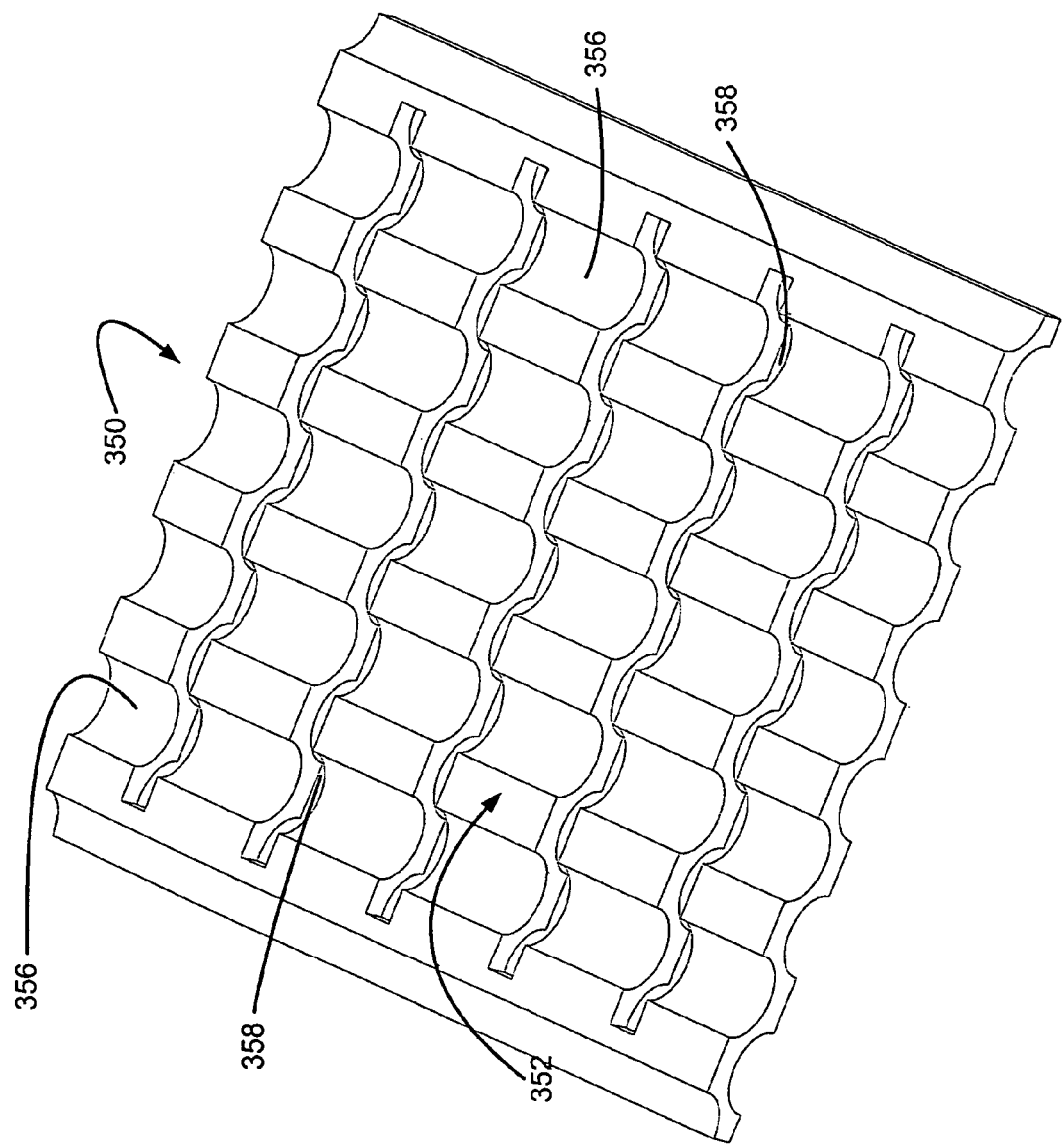
FIG. 12 is a perspective view of another embodiment of a heat transfer plate constructed in accordance with the teachings of the present invention.
Figure 13:
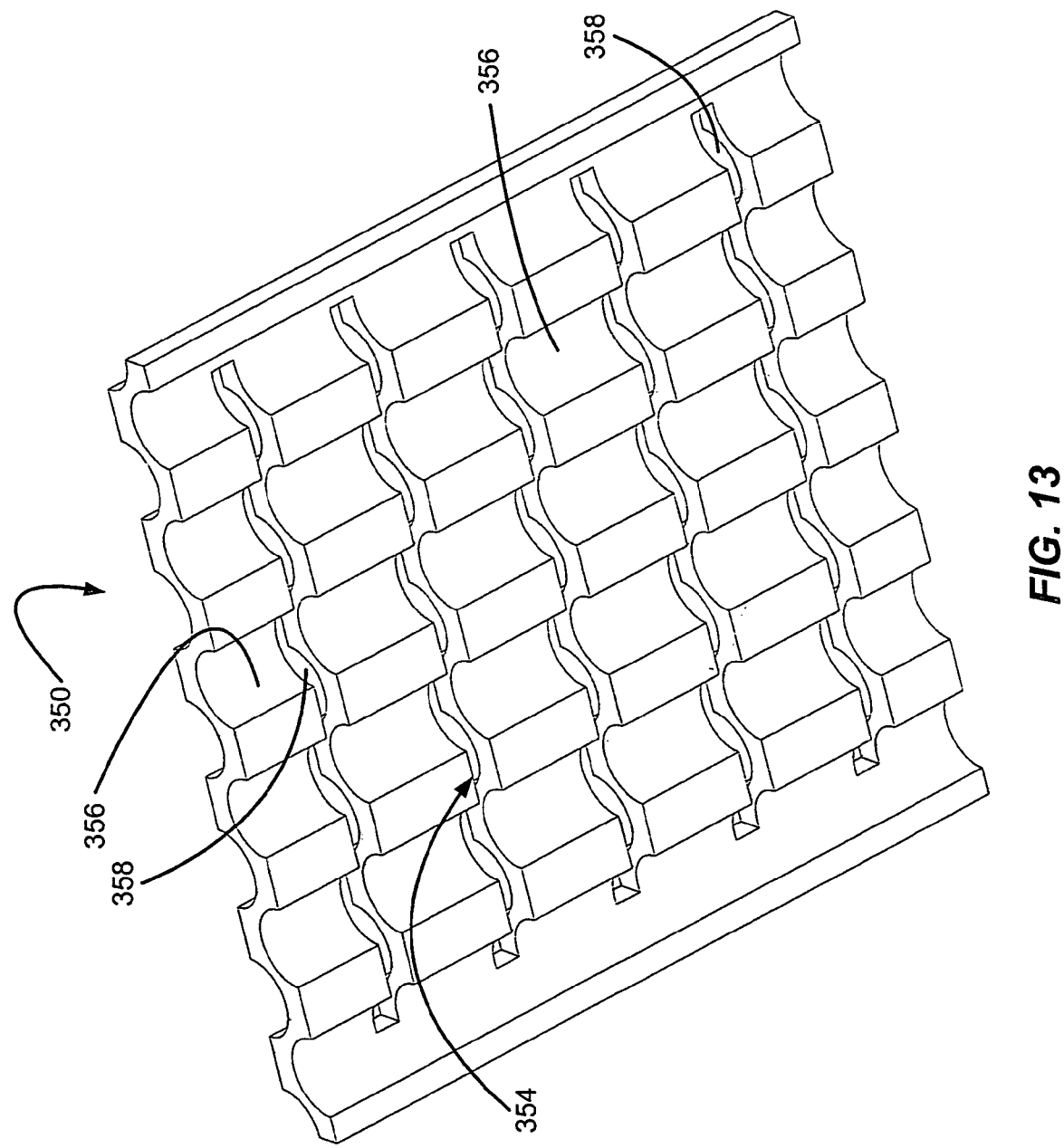
FIG. 13 is similar to FIG. 12 and shows an opposite face of the heat transfer plate.

With reference to FIGS. 12 and 13, another embodiment of a transfer plate 350 is shown and constructed in accordance with the teachings of the present invention. The heat transfer plate may have a first side 352 (FIG. 12) and a second side 354 (FIG. 13). The first side 352 and the second side 354 of the heat transfer plate 350 may include a plurality of valleys 356 formed thereon. The plurality of valleys may intersect with a plurality of channels 358 also formed thereon. The intersecting valleys 356 and channels 358 may give the heat transfer plate 350 a wave-like appearance. It may be appreciated that the plurality of valleys 356 and channels 358 may be cut into the heat transfer plate 350 using the exemplary above-described etching processes. When the heat transfer plate 350 is compressed between the heat-generating device 12 (FIG. 2) and heat-removing device 14 (FIG. 2) the valleys 356 of the heat transfer plate 350 may compress and deform thereby making relatively better contact with the surface irregularities of the two devices 12, 14.

Figure 14:
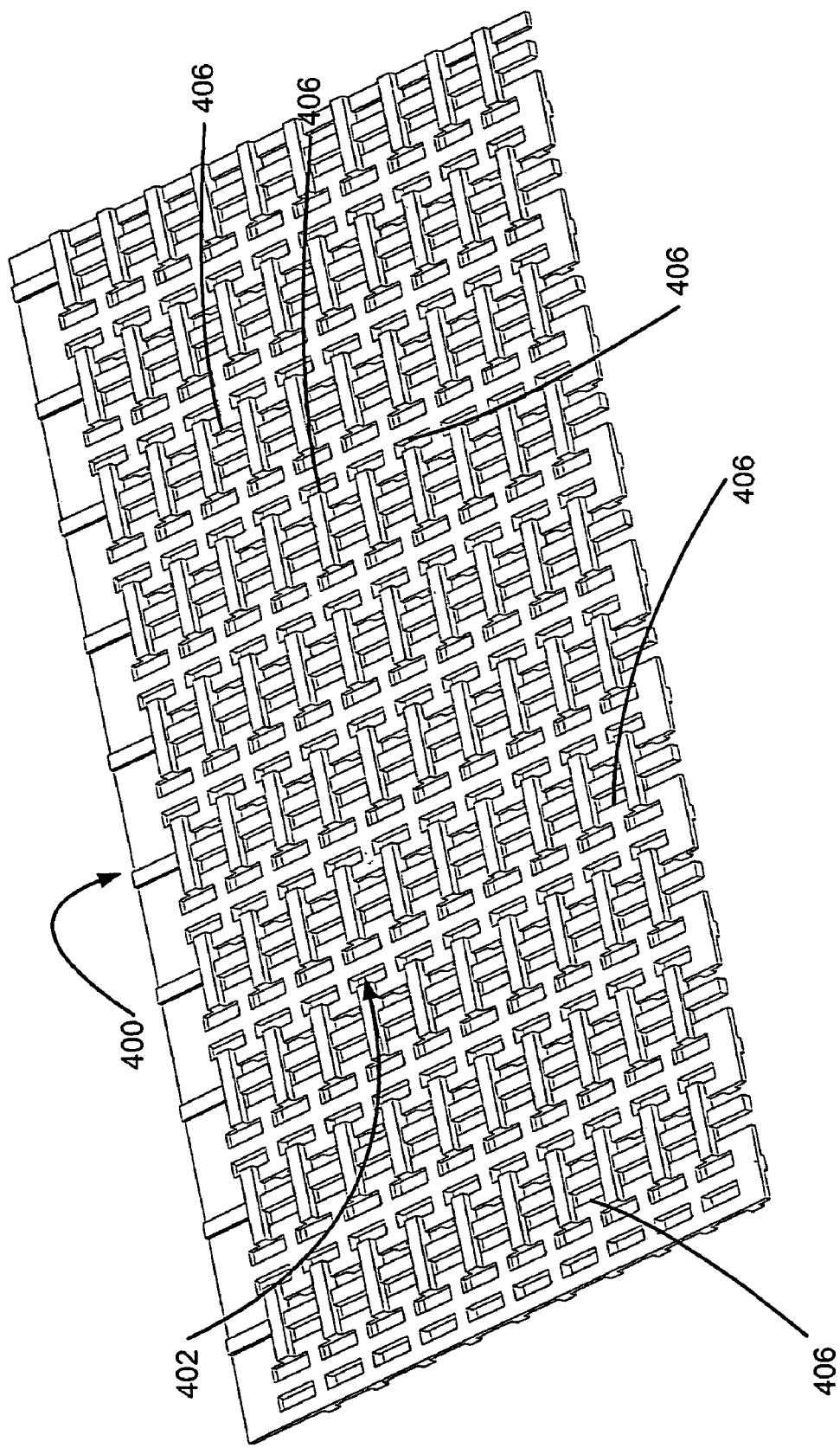
FIG. 14 is a perspective view of another embodiment of a heat transfer plate constructed in accordance with the teachings of the present invention.
Figure 15:
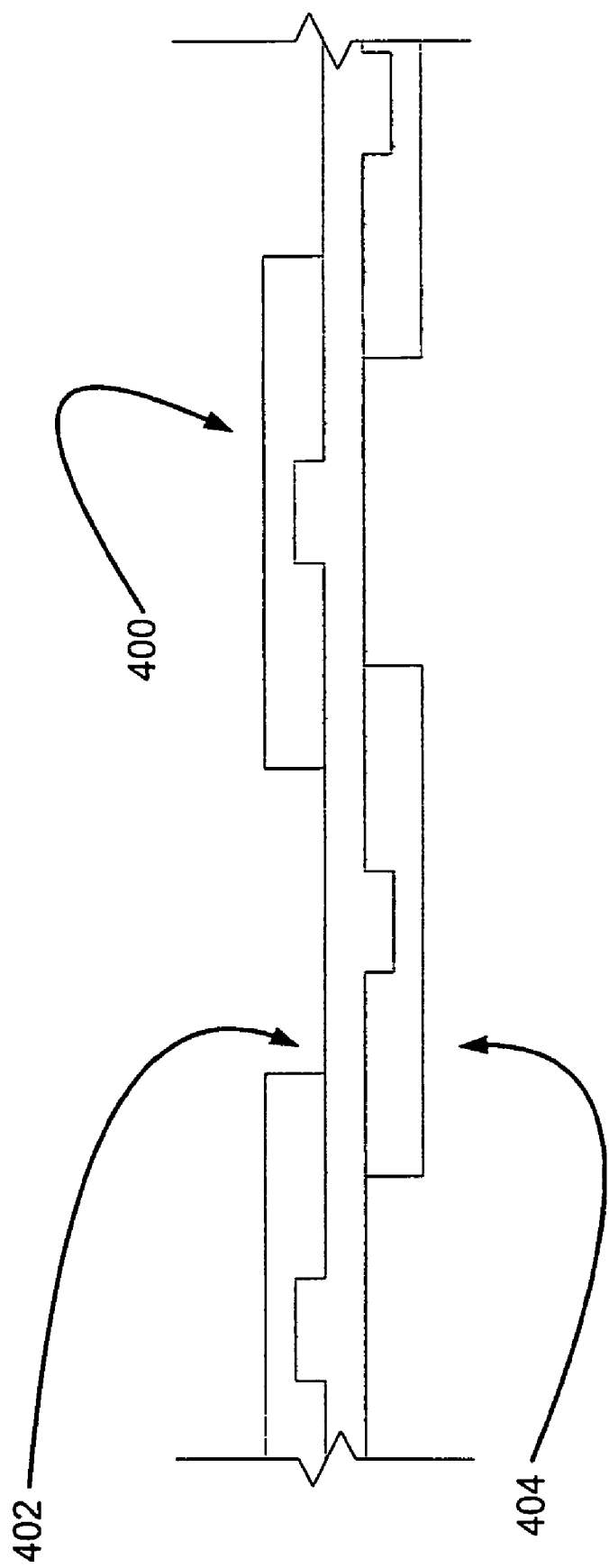
FIG. 15 is similar to FIG. 14 and shows a side view of the heat transfer plate.

With reference to FIGS. 14 and 15, another embodiment of a heat transfer plate 400 is shown, constructed in accordance with the teachings of the present invention. The heat transfer plate 400 may include a first side 402 and a second side 404. The heat transfer plate 400 may include a plurality of rectangular cut slots 406. The slots 406 may be cut from the heat transfer plate 400 using the above-described etching process. The heat transfer plate 400 may be compressed between the heat-generating device 12 (FIG. 2) and the heat-removing device 14 (FIG. 2) thereby conforming to the surface irregularities of the two devices 12, 14.

In various embodiments, the heat transfer plate may be crafted by taking a rectangular plate similar to the starting plate of the above described other embodiments. An etched or stamped screen may be pressed into the heat transfer plate. By pressing the screen into the heat transfer plate a plurality of ridges and valleys are formed in the plate. After pressing the screen into the plate, the screen is removed. The plate is left with the plurality of ridges and valleys which thereby weaken the plate. The end result is similar to the above-described etching process, thus allowing the plate to be compressed between a heat-generating device 12 (FIG. 2) and a heat-removing device 14 (FIG. 2) to thereby-conform to the surface irregularities of the two devices 12, 14.

Those skilled in the art-may now appreciate from the foregoing description that the broad teachings of the present invention may be implemented in a variety of forms. Therefore, while this invention has been described in connection with particular examples thereof, the true scope of the invention should be not so limited since other modifications will become apparent to the skilled practitioner upon a study of the drawings, the specification and the following claims.

What is claimed is:

1. An apparatus for coupling a heat-generating device to a heat-removing device comprising:
   a conformable plate having a first side with a first surface and a second side with a second, opposite surface;
   a plurality of first channels that intersect with a plurality of second channels recessed in said first surface of said first side each having a depth relative to said first surface;
   a plurality of third channels recessed in said second, opposite surface of said second side, each of said third channels having a depth relative to said second surface;
   a plurality of protrusions formed from said first surface and said intersections of said first channels and said second channels, each of said protrusions include a face and walls that surround said face, said face is formed from said first surface, and said walls define a height based on said depth of said first and said second channels, said protrusions are deformable by coupling said conformable plate between the heat-generating device and the heat-removing device; and
   a pattern of apertures formed through said conformable plate, said first channels and said third channels project inwardly to form said pattern of apertures through said conformable plate in intersections of said first and said third channels.

2. The apparatus of claim 1 wherein each of said protrusions include said face having a surface area that abuts one of the heat-generating device and the heat-removing device, at least one of said faces increasing said surface area when compressed between the heat-generating device and the heat-removing device.

3. The apparatus of claim 2 wherein said conformable plate is a thermally conductive plate that is electrically insulated.

4. The apparatus of claim 3 wherein said conformable plate is at least partially coated with parylene.

5. The apparatus of claim 3 wherein said conformable plate is made of copper.

6. The apparatus of claim 1 wherein said conformable plate has a dimension defining a thickness and said dimension is about 0.003 inches (about 0.076 millimeters).

7. The apparatus of claim 1 wherein at least one of said first, said second, and said third channels have a dimension defining a width, said dimension is about 0.003 inches (about 0.076 millimeters).

8. The apparatus of claim 1 wherein a width of at least one of said first, said second, and said third channels is about equal to a thickness of said conformable plate.

9. The apparatus of claim 1 wherein said pattern of apertures are formed entirely in said intersections of said first and said third channels.

10. A method comprising:
    providing a conformable plate having a first side with a first surface and a second side having a second, opposite surface, said conformable plate made of a thermally conductive material;
    removing material in said first surface of said conformable plate to form recessed channels and protrusions at intersections of said channels; and
    removing material in said second, opposite surface of said conformable plate to form recessed channels in said second, opposite surface,
    said removing of material in said first surface and said second, opposite surface cooperatively forms a pattern of apertures through said conformable plate at intersections of said recessed channels on said first surface and said second, opposite surface,
    each of said protrusions at said intersections of said channels on said first surface having a face formed from said first surface and surrounding walls formed from said recessed channels on said first surface.

11. The method of claim 10 further comprising pressing a structure into said conformable plate to form said at least one of said intersecting channels and said protrusions.

12. The method of claim 10 further comprising at least partially coating said conformable plate with parylene.

13. The method of claim 10 further comprising compressing said conformable plate between a first object and a second object, wherein said compressing of said conformable plate increases a surface area at which said conformable plate abuts at least one of a first surface on said first object and a second surface on said second object.

14. The method of claim 10 wherein said pattern of apertures are formed entirely in said intersections of said channels on said first side and said second, opposite side.

15. The method of claim 10 wherein said walls that surround said face of each of said protrusions define a height based on said depth of said channels on said first surface.

16. An apparatus for coupling a heat-generating device to a heat-removing device comprising:
    a thermally conductive plate having a first planar surface and a second, opposite planar surface;
    N first channels projecting inwardly to said thermally conductive plate from said first planar surface;
    M sets of O second channels projecting inwardly to said thermally conductive plate from said first planar surface and substantially perpendicular to said N first channels;
    a plurality of protrusions formed from said first planar surface at intersections of said N first channels and said O second channels, each of said protrusions include a face formed from said first planar surface and walls that surround said face that are formed from said N first channels and said O second channels;
    P third channels projecting inwardly to said thermally conductive plate from said second, opposite, planar surface; and
    M sets of Q apertures formed in intersections of said O second channels on said first planar surface and said P third channels on said second, opposite surface, said O second channels and said P third channels project toward one another to form said Q apertures through said thermally conductive plate, wherein said N, M, O, P, and Q are integers greater than one.

17. The apparatus of claim 16 wherein said M sets of Q apertures are formed through said thermally-conductive plate.

18. The apparatus of claim 16 wherein said M sets of Q apertures are formed entirely in said intersections of said O second channels and said P third channels.

* * * * *